United States Patent
Badr et al.

(10) Patent No.: US 9,843,413 B2
(45) Date of Patent: Dec. 12, 2017

(54) FORWARD ERROR CORRECTION FOR LOW-DELAY RECOVERY FROM PACKET LOSS

(71) Applicant: Cisco Technology, Inc., San Jose, CA (US)

(72) Inventors: Ahmed Badr, Toronto (CA); Ashish Jagadish Khisti, Toronto (CA); Dan Tan, Sunnyvale, CA (US); John George Apostolopoulos, Palo Alto, CA (US)

(73) Assignee: Cisco Technology, Inc., San Jose, CA (US)

( * ) Notice: Subject to any disclaimer, the term of this patent is extended or adjusted under 35 U.S.C. 154(b) by 84 days.

(21) Appl. No.: 15/081,133

(22) Filed: Mar. 25, 2016

(65) Prior Publication Data
US 2017/0279558 A1   Sep. 28, 2017

(51) Int. Cl.
*H04L 1/00* (2006.01)
*H04L 12/815* (2013.01)

(52) U.S. Cl.
CPC .......... *H04L 1/0057* (2013.01); *H04L 1/0009* (2013.01); *H04L 1/0045* (2013.01); *H04L 47/22* (2013.01)

(58) Field of Classification Search
CPC ... H04L 1/0009; H04L 1/0041; H04L 1/0045; H04L 1/0057; H04L 1/0061; H04L 1/0064; H03M 13/00; H03M 13/25
See application file for complete search history.

(56) References Cited

U.S. PATENT DOCUMENTS

| | | | | |
|---|---|---|---|---|
| 5,870,412 A | * | 2/1999 | Schuster | ........... H03M 13/2703 714/752 |
| 7,698,618 B2 | * | 4/2010 | Oliva | .................... H04L 1/0001 714/752 |
| 2012/0290900 A1 | * | 11/2012 | Paniconi | ............. H03M 13/353 714/776 |
| 2014/0136923 A1 | | 5/2014 | Smith et al. | |
| 2014/0281837 A1 | * | 9/2014 | Frigo | .................... H04L 1/0041 714/776 |

OTHER PUBLICATIONS

Gomez et al., Combining media specific FEC and error concealment for robust distributed speech recognition over loss prone packet channels, Dec. 2006, IEEE, Trans. on Multi-Media, vol. 8, No. 6, pp. 1228-1237.*

(Continued)

*Primary Examiner* — Shelly A Chase
(74) *Attorney, Agent, or Firm* — Edell, Shapiro & Finnan, LLC

(57) ABSTRACT

An encoder receives a sequence of packets. For each packet, the encoder selects a window of at least previous packets in the sequence of packets. The encoder identifies in the window one or more earlier packets among the previous packets and one or more later packets separated from the one or more earlier packets by a gap including gap packets. The encoder encodes the one or more earlier packets and the one or more later packets into a forward error correction (FEC) packet corresponding to the packet, without using any of the gap packets, and transmits the FEC packet and the packet.

21 Claims, 6 Drawing Sheets

(56) References Cited

OTHER PUBLICATIONS

Yu et al, Evaluation of the residual packet loss rate using packet level FEC for delay constrained media network transport, Sep. 2006, ACM digital Library, pp. 1 to 5.*
International Search Report and Written Opinion in counterpart International Application No. PCT/US2017/023313, dated Jun. 30, 2017, 15 pages.
Tirronen, "Sliding Window-Based Erasure Correction Using Biased Sampling," Fourth International Conference on Systems and Networks Communication, 2009, ICSNC '09, Sep. 2009, pp. 144-152.
Gomez-Barquero, "Bluebook on Upper Layer FEC in DBV, First Contribution from the Polytechnic University of Valencia," Digital Video Broadcasting, Oct. 2008, 15 pages.
Ahmed Badr et al., "Streaming Codes With Partial Recovery Over Channels With Burst and Isolated Erasures", IEEE Journal of Selected Topics in Signal Processing, vol. 9, No. 3, Apr. 2015, 16 pages.
Heide Gluesing-Luerssen et al., "Strongly-MDS Convolutional Codes", IEEE Transactions on Information Theory, vol. 52, No. 2, Feb. 2006, 15 pages.

* cited by examiner

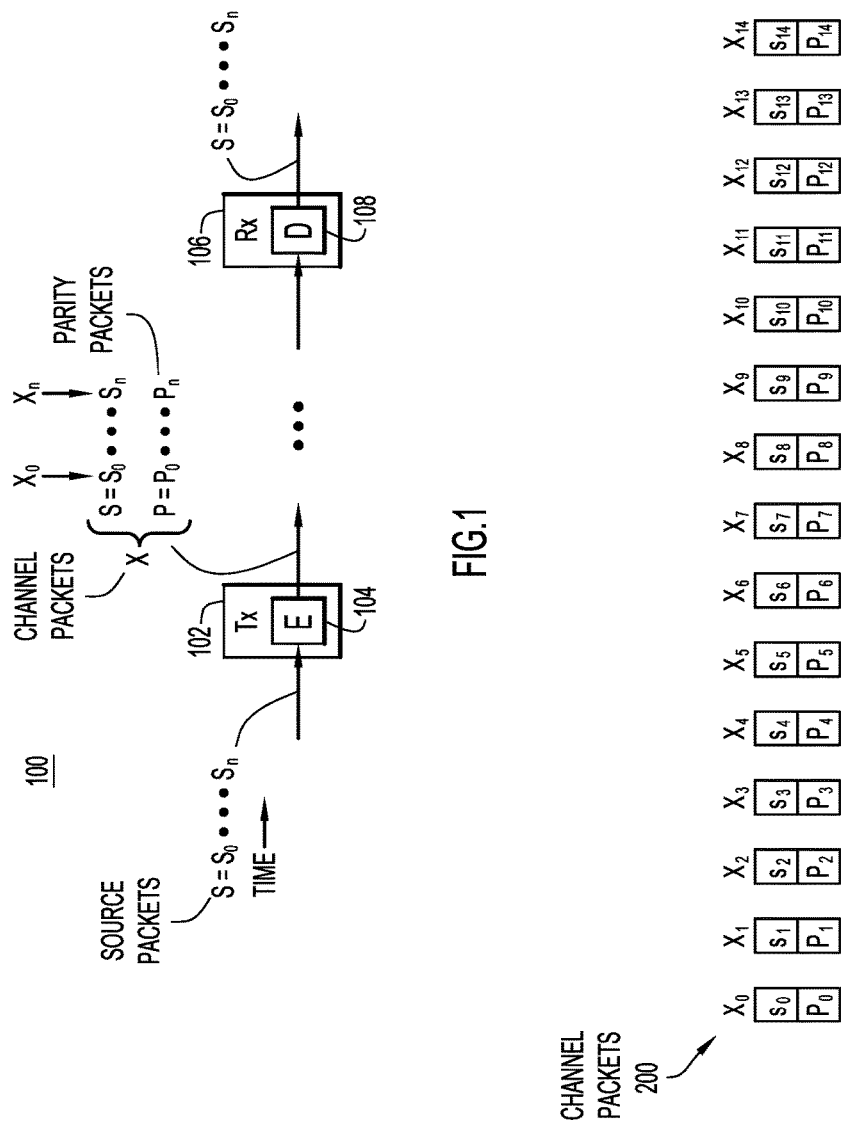

FORWARD ERROR CORRECTION FOR LOW-DELAY RECOVERY FROM PACKET LOSS

TECHNICAL FIELD

The present disclosure relates to forward error correction coding.

BACKGROUND

Real-time multimedia conferencing applications are afflicted by severe degradations when packet losses occur over a communication network. Two general approaches used to recover from such packet losses are (1) retransmission-based approaches, and (2) forward error correction (FEC) approaches. Retransmission-based approaches, such as Transmission Control Protocol (TCP), lead to a packet loss recovery delay that is greater than the round-trip delay of the system, which is unacceptably large in some use cases. Therefore, conferencing applications focus on using FEC codes for recovering from packet losses. One type of generalized FEC code has the property of a low recovery delay (i.e., decoding delay) from one or two packet losses, but also has a disadvantageously long recovery delay from a block or burst of packet losses. Another type of FEC code yields a low recovery delay from a burst of packet losses, but has a disadvantageously long recovery delay from only one or two packet losses.

BRIEF DESCRIPTION OF THE DRAWINGS

FIG. 1 is a communication system is in which encoding and decoding embodiments using sparse codes may be implemented, according to an example embodiment.

FIG. 2 is an illustration of an ordered sequence of channel (i.e., encoded) packets generated by an encoder of the system of FIG. 1, according to an example embodiment.

DESCRIPTION OF EXAMPLE EMBODIMENTS

Overview

Figure 3:
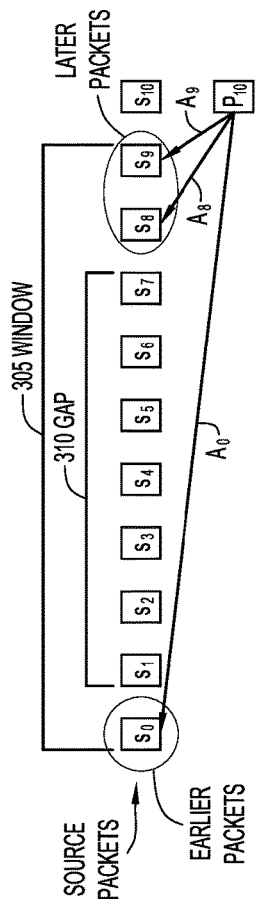
FIG. 3 is an illustration of a source packet factor graph used for constructing a parity packet based on an inter-packet sparse code, according to an example embodiment.

A method comprises receiving a sequence of packets and, for each packet, performing the following processing. A window of at least previous packets in the sequence of packets is selected. In the window, one or more earlier packets among the previous packets and one or more later packets separated from the one or more earlier packets by a gap including gap packets are identified. The one or more earlier packets and the one or more later packets are encoded into a forward error correction (FEC) packet corresponding to the packet, without using any of the gap packets. The FEC packet and the source packet are transmitted.

Example Embodiments

Referring to FIG. 1, an example communication system 100 is shown in which encoding and decoding embodiments using sparse codes may be implemented. System 100 includes a transmitter (TX) 102 having an encoder (E) 104, and a receiver (RX) 106 having a decoder (D) 108. Encoder 104 receives a stream of source packets s, which may be an ordered sequence of successive source packets $s=\{s_0, s_1, s_2,$ and so on$\}$, where subscript i of each source packet $s_i$ indicates a successively increasing incremental time or sequence number order relative to the previous subscript. That is, the sequence may be ordered in time or sequence number space. Source packets s may include audio packets including audio data, video packets including video data, or packets that include other forms of multimedia data. For example, the packets may include multimedia data used in interactive computer games and exchanged between computer game consoles.

As source packets s arrive at encoder 104, the encoder encodes the source packets into channel packets x (also referred to as encoded packets x) that include both source packets s and forward error correction (FEC) or parity check packets p, i.e., channel packets x=(s, p). "Parity check packets" are also referred to simply as "parity packets." Transmitter 102/encoder 104 transmits channel packets x to receiver 106. In an example, channel packets x may be represented as an ordered sequence of successive channel packets $x=\{x_0=(s_0, p_0); x_1=(s_1, p_1); x_2=(s_2, p_2),$ and so on$\}$, such that each source packet $s_i$ has a corresponding parity packet $p_i$. Encoder 104 generates each parity packet $p_i$ corresponding to each source packet $s_i$ based on code constructions described below. Encoder 104 may combine each source packet $s_i$ with the corresponding parity packet $p_i$ into a single corresponding channel packet $x_i$, and transmit each channel packet in correspondence with each source packet. Alternatively, encoder 104 may transmit each source packet $s_i$ separately from its corresponding parity packet $p_i$. As used herein, the term "contiguous" means immediately successive in an ordered sequence or successively adjacent in the ordered sequence, e.g., the 3 source packets $s_1$, $s_2$, and $s_3$ represent contiguous source packets, whereas the three source packets $s_1$, $s_2$, and $s_{10}$ are not contiguous because $s_{10}$ is not immediately successive to $s_2$.

Transmitter 102 transmits channel packets x, including source packets s and parity packets p, to receiver 106 over a wired and/or wireless communication channel, which may traverse one or more communication networks. Decoder 108 receives at least a subset of channel packets x and recovers (or attempts to recover) source packets s from the received channel packets. Decoder 108 uses parity packets p in channel packets x to assist in recovering any of source packets s that were lost during their transmission over the communication channel. Decoder 108 generates a recovered source packets (s) representative of the transmitted source packets s that the decoder is able to recover.

With reference to FIG. 2 there is an illustration of an ordered sequence 200 of channel packets $x_1$-$x_{14}$ corresponding to times $t_0$-$t_{14}$ generated by encoder 104 in the embodiment in which the encoder combines each source packet $s_i$ with each parity packet $p_i$ into a corresponding single channel packet $x_i$. In an example, encoder 104 concatenates each source packet $s_i$ with its corresponding parity packet $p_i$.

Embodiments described below are directed to general code constructions for parity packets (referred to below simply as "parity packets") that result in low recovery delay streaming codes with multiple decoding deadlines. Attributes of the general code constructions include:

a. Inter-Packet Sparsity: The construction of parity packets based on the code constructions uses a short-term memory of most recently (i.e., later) received source packets, an older-term memory of earlier received source packets, and skips source packets between the earlier and later received source packets. This approach also generalizes to multiple orders of memory.

b. Intra-Packet Sparsity: Within each selected source packet, a fixed/structured portion of information symbols are skipped when generating the parity packets.

Two examples of FEC streaming codes with low-delay recovery are described below, where decoding delay is not fixed, but varies with the packet erasure sequence. For "benign" erasure sequences the decoding delay is smaller while for "severe" erasure sequences the delay is longer.

Example Code 1—Inter-Packet Sparse Code

The first example code is a rate ½ inter-packet sparse code that recovers from the following channel packet erasure/loss sequences with the indicated decoder recovery delays:

a. Sequence 1: Single Loss: Delay=1;
b. Sequence 2: Two Consecutive (Burst) Losses: Delay=3;
c. Sequence 3: Burst Loss of Length B=3 to 8: Delay=10; and
d. Sequence 4: Burst Loss with Length B Greater Than 8: Partial Recovery: Delay=10.

At time i, source packet $s_i$ is an input packet and channel packet $x_i$ is an output packet. Channel packet $x_i=(s_i, p_i)$, where parity packet $p_i$ is the same size, e.g., includes the same number of bits/bytes, as source packet $s_i$. It is understood that the parity data in a parity packet may be concatenated with source data in a source packet or, alternatively, the parity data may be provided separately from the source data, i.e., in a separate parity packet. The generalized code for each current parity packet $p_i$ is a function of previous source packets (i.e., source packets received prior to time i). More specifically, each parity packet $p_i$ is a linear combination, e.g., a summation, of amplitude-scaled, previous source packets, according to the equation: $p_i = a \cdot s_{i-1} + b \cdot s_{i-2} + c \cdot s_{i-10}$, where a, b, and c are scalar values/weights. For simplicity, a, b, and c are each set equal to 1, but other values may be used in other examples. In an example, each source packet in the equation for $p_i$ may be represented as a value or set of values derived from a signal amplitude, or set of signal amplitudes, in the source packet, as would be understood by one of ordinary skill in the relevant arts based on the present description.

As each source packet $s_i$ is received by encoder 104, the encoder encodes a corresponding parity packet $p_i$ based on the code $p_i = s_{i-1} + s_{i-2} + s_{i-10}$. For example, when encoder 104 receives source packet $s_{10}$ and sends $x_{10}=(s_{10}, p_{10})$ over the channel, the encoder encodes parity packet $p_{10}$ as $p_{10}=s_9+s_8+s_0$, as will now be described with reference to FIG. 3.

FIG. 3 is an illustration of an example source packet factor graph used for constructing parity packet $p_{10}$ based on the first example code at an instant in time t=10 (i.e., $t_{10}$) when encoder 104 has just received current source packet $s_{10}$, after having already received previous source packets $s_0$-$s_9$. Encoder 104 selects an encoding window 305 spanning contiguous previous source packets $s_0$-$s_9$. Within window 305, encoder 104 identifies one or more contiguous earlier received source packets, e.g., source packet $s_0$, and one or more contiguous later received source packets, e.g., source packets $s_8$ and $s_9$, spaced apart from the earlier received source packets (e.g., $s_0$) by a packet gap 310 including 7 contiguous gap packets, i.e., source packets $s_1$-$s_7$. Thus, window 305 has a first end that coincides with the earlier received source packets in the window and a second end that coincides with the later received source packets in the window.

Encoder 104 identifies the earlier and later received source packets (e.g., $s_0$ and $s_8$, $s_9$, respectively) within window 305 based on the generalized code. In an example, encoder 104 identifies dependencies/pointers (shown as dependency arrows $A_0$, $A_8$, and $A_9$ in FIG. 2) between parity packet $p_{10}$ and source packets $s_0$, $s_8$, and $s_9$, respectively, on which computation of the parity packet depends. Encoder 104 computes parity packet $p_{10}$ based on identified source packets $s_0$, $s_8$, and $s_9$ in accordance with the generalized code construction.

Then, when next successive source packet $s_{11}$ arrives (enters on the right-hand-side of FIG. 3), encoder 104 (i) slides the window (305) used for parity packet $p_{10}$ (which is now considered a previous window) one position to the right in FIG. 3 so that the (slid) window includes source packets $s_1$-$s_{10}$, instead of source packets $s_0$-$s_9$, and (ii) repeats the above-described process to encode corresponding parity packet $p_{11}$ for source packet $s_{11}$ based on the source packets in the (updated) window. This process continues over time as each successive source packet arrives.

In the example of FIG. 3, window 305 includes only previously received source packets $s_0$-$s_9$ with respect to current source packet $s_{10}$. In other examples, window 305 may be extended to also include current source packet $s_{10}$ so that the one or more later received packets encoded into parity packet $p_{10}$ may also include current source packet $s_{10}$. Also, in the example of FIG. 3, the one or more earlier received source packets include only one source packet $s_0$; other examples may include multiple source packets. Similarly, in the example of FIG. 3, the one or more later received source packets include 2 source packets $s_8$ and $s_9$; however, more or less source packets may be used. In addition, gap 310 may be adjusted to include more or less gap packets.

As mentioned above, transmitter 102 transmits channel packets x to receiver 104 over a communication channel. Over time, channel statistics indicative of channel transmission conditions, such as average channel packet losses or average burst loss length, may be collected using any known technique. For example, receiver 106 may collect such statistics, or a channel monitor may be employed to observe the channel transmission conditions. The channel statistics may represent/indicate a distribution of erasure burst lengths, including, on average, how frequently channel packets are lost/erased and an average erasure burst length. The average erasure burst length represents a total number of contiguous channel packets that are erased on average when channel packets are lost, such as 2, 3, or 10 channel packets, for example. A histogram of channel burst loss lengths may also be used. Such channel statistics may be transmitted to transmitter 102 and thus provided to encoder 104. Encoder 104 may determine and adjust a length of the packet gap (i.e., a total number of packets in the packet gap) based on the channel statistics in order to mitigate the burst losses. For example, encoder 104 may increase and decrease the gap length in correspondence with indications of an increase and a decrease in average erasure burst length.

The operation of decoder 108 based on the first example code, specifically, decoder source packet loss recovery, is now described with reference to several example erasure/loss sequences 1-4. Each erasure/loss sequence assumes that any source packets and channel packets before time zero, i.e., previous to source packet $s_0$ and channel packet $x_0=(s_0, p_0)$ are known to decoder 108 from successful receipt and decoding of previous channel packets. Similarly, the encoder may also adapt the window length.

Sequence 1: Single Isolated Loss of a Channel Packet:

If channel packet $x_0$ is erased, i.e., lost during transmission from transmitter 102 to receiver 106, then source packet $s_0$ can be recovered by decoder 108 using the code equation: $p_1=s_0+s_{-1}+s_{-9}$, because parity packet $p_1$ and the last two source packets $s_{-1}+s_{-9}$ are known to the decoder, i.e., the only unknown in the equation is source packet $s_0$.

Figure 4:
FIG. 4 is an illustration of decoder recovery from a single isolated loss of a channel packet, according to an example embodiment.

With reference to FIG. 4, there is an illustration of decoder recovery from the single isolated loss of channel packet $x_0$. In FIG. 4, the "X" on channel packet $x_0=(s_0, p_0)$ indicates erasure of that channel packet, and the arrow from channel packet $x_1=(s_1, p_1)$ indicates that decoder 108 recovers source packet $s_0$ based on channel packet $x_1$.

In a corollary to a single isolated loss of a channel packet, alternating single losses (i.e., erasures of channel packets) with at least one non-erasure (i.e., non-erased channel packet) separating each erasure can be all decoded with a delay T=1 time increment.

Sequence 2: Two Consecutive Channel Packet Losses:

Suppose that consecutive channel packets $x_0$ and $x_1$ are both erased. Then decoder 108 uses:

$$p_2=s_0+s_1+s_{-8}; \text{ and}$$

$$p_3=s_1+s_2+s_{-7}.$$

All of the packets in the above two equations are known to decoder 108, except for source packets $s_0$ and $s_1$. So, the above two equations represent two equations with two unknowns, i.e., source packets $s_0$ and $s_1$, which can thus be recovered at time T=3 corresponding to the receipt of channel packet $x_3=(s_3, p_3)$. Thus the recovery delay from the time of erasure is T=3.

Figure 5:
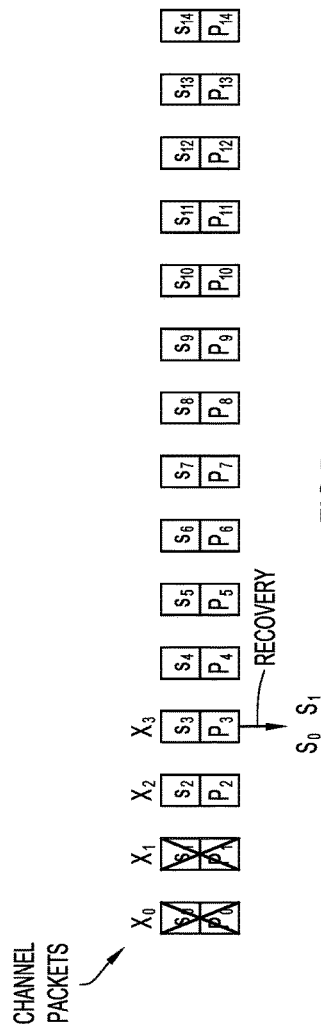
FIG. 5 is an illustration of decoder recovery from two consecutive channel packet losses, according to an example embodiment.

With reference to FIG. 5, there is an illustration of decoder recovery from the above-described consecutive channel packet loss. In FIG. 5, channel packets $x_0$ and $x_1$ are erased, but decoder 108 recovers source packets $s_0$ and $s_1$ at channel packet $x_3$ based on channel packets $x_2$ and $x_3$.

Sequence 3: Continuous Burst of Channel Packet Losses of Length B=8:

Assume the burst of losses (erasures) is in an interval t=[0, 7], i.e., the burst length B=8 channel packets $x_0$-$x_7$. Decoder 108 ignores parity packets $p_8$ (=$s_{-2}+s_6+s_7$) and $p_9$ (=$s_{-1}+s_7+s_8$) at times t=8, 9. But, at time t=10, decoder 108 uses the following equation for parity packet $p_{10}$: $p_{10}=s_0=s_8+s_9$.

In the above equation for parity packet $p_{10}$, only source packet $s_0$ is unknown. Hence, source packet $s_0$ is recovered with a delay of T=10.

Similarly each of source packets $s_1$-$s_7$ is recovered from parity packets (from corresponding channel packets) $p_{11}$-$p_{17}$, sequentially and each with a delay of T=10.

Figure 6:
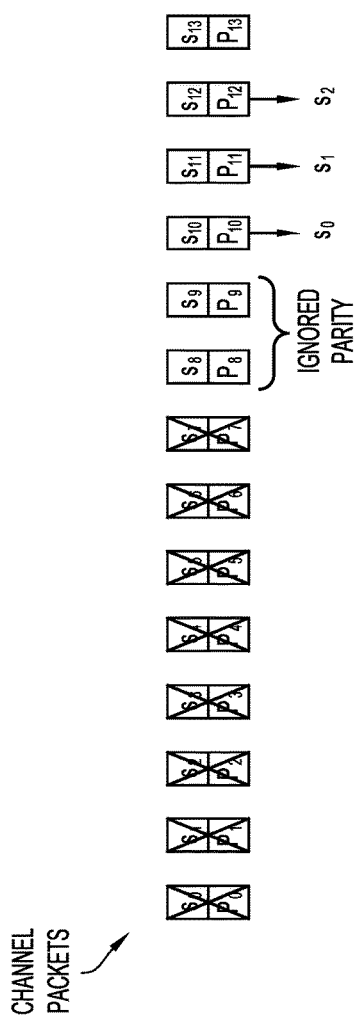
FIG. 6 is an illustration of decoder recovery from a burst of channel packet losses, according to an example embodiment.

With reference to FIG. 6, there is an illustration of decoder recovery from the above-described burst channel packet loss of burst length B=8. In FIG. 6, channel packets $x_0$-$x_7$ are erased, but source packets $s_0$, $s_1$, . . . $s_7$ are recovered at channel packets $x_{10}$, $x_{11}$, . . . $x_{17}$.

Sequence 4: Burst of Channel Packet Loss Greater Than 9:

If a loss burst of length B=9 occurs, decoder 108 skips parity packets $p_9$ and $p_{10}$. Starting at time t=11, decoder 108 recovers the remainder of the burst beginning with source packet $s_{-1}$. Thus, only source packet $s_0$ is not recovered. A similar approach is used for longer bursts.

Several general properties of the first example code are now discussed. The first example code is an example of a structured inter-packet sparse code. As shown in FIG. 3, the construction of the first example code is sparse in source packet selection, i.e., source packets $s_1$-$s_7$ are not used in generating $p_{10}$. A general coding principle here is to use only a sparse subset of source packets, with one or more contiguous sequences of source packets omitted, to generate parity packets. The first example code can also be viewed as embedding multiple codes of different groups of source packets. For example, the factor graph of FIG. 3 can be viewed as embedding two different codes on two different groups of source packets. In the generation of $p_{10}$:

a. Group 1 comprises packets $s_8$ and $s_9$ and a corresponding parity check is $s_8+s_9$; and
b. Group 2 comprises source packet $s_0$ and a corresponding parity check (repetition) is also $s_0$.

The parity checks from the above two code groups are combined into parity packet $p_{10}$.

Thus, a generalized method of generating a parity packet based on (a) and (b) includes selecting an encoding window of source packets, dividing the source packets in the window into multiple groups of source packets, applying a different code to each group, and combining the resulting parity packets. The codes may give different levels of protection to different groups.

Example Code 2—Intra-Packet Sparse Code

The second example code is a rate 3/5 intra-packet sparse code, that recovers from the following channel packet erasure/loss sequences with the indicated decoder recovery delays:

a. Sequence 1: Single Loss: Delay=2; and
b. Sequence 2: Burst Loss of Length Between 2 to 7: Delay=12.

The second example code is derived/constructed using the following operations:

a. Assume each source packet $s_i$ has 3 (source) symbols, which may each include one or more data bytes;
b. Mark the first two symbols as a first sub-packet $u_i$;
c. Mark the third symbol as a second sub-packet $v_i$;
d. Apply a rate R=1/3 erasure code with memory M–12 to the sequence $v_i$ to generate two parity symbols, marked by a vector $q_i=f(v_{i-1}, \ldots v_{i-12})$;
e. Generate a parity symbol vector $p_i=q_i+u_{1-12}+u_{i-1}$; and
a. Transmit channel packet $x_i=(u_i, v_i, p_i)$.

Figure 7:
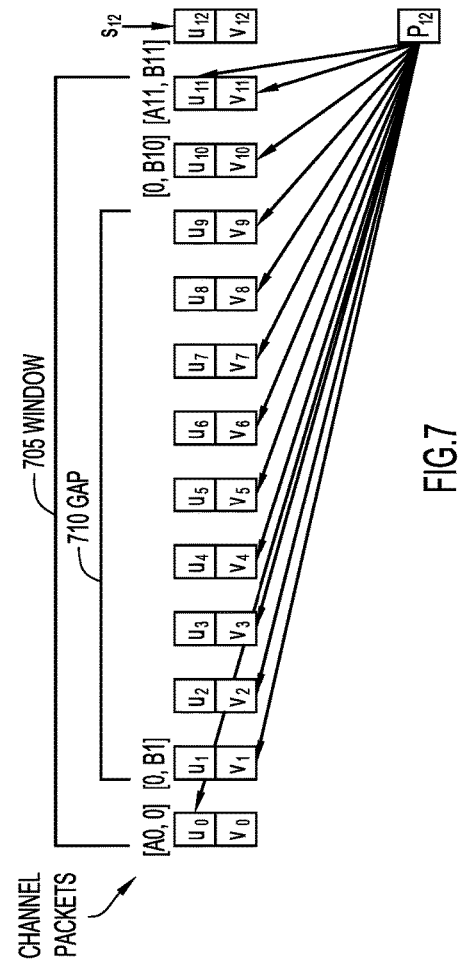
FIG. 7 is an illustration of a source packet factor graph used for constructing a parity packet based on an intra-packet sparse code, according to an example embodiment

With reference to FIG. 7, there is an illustration of a source packet factor graph used for constructing parity packet $p_{12}$ based on the second example code at an instant in time when encoder 104 has just received current source packet $s_{12}$, after having already received previous source packets $s_0$-$s_{11}$. Encoder 104 selects window 705 to span all of the source packets used for generating parity packet $p_{12}$. Within window 705, encoder 108 encodes first sub-packet $u_0$ of source packet $s_0$ and first sub-packet $u_{11}$ of source packet $s_{11}$ (separated from first sub-packet $u_0$ by a gap 710 of 10 source packets $s_1$-$s_{10}$) into a first sub-parity packet for parity packet $p_{12}$. Encoder 104 additionally encodes all of second sub-packets $v_1$-$v_{11}$ of respective source packets $s_1$-$s_{11}$ (with no gaps) into a second sub-parity packet for parity packet $p_{12}$. The first and second sub-parity packets are merged or concatenated to form parity packet $p_{12}$.

The u and v sub-packets, also referred to as u and v sub-layers, may be encoded with different rate codes. For example, the v sub-packets are encoded with a rate $R=1/3$ erasure code, while the u sub-packets may be encoded with a rate $R=1/3$ erasure code. In FIG. 7, the arrows pointing from parity packet $p_{12}$ to respective ones of sub-packets u and v in the various source packets s show the aforementioned dependency of the parity packet on the various sub-packets. Specifically, parity packet $p_{12}$ is only a function of the u packets at time 0 and 11, and is not a function of the intermediate u packets. Thus, a large dependency gap is maintained only for the u layer. The proposed construction may be extended to achieve any rate $0<R<1$, by splitting each source packet into sub-packets (i.e., layers), applying a different error correction code to each layer, and merging or concatenating the resulting parity packets.

Decoder operation based on the second example code is now described with reference to several example erasure/loss sequence 1-2. Each loss sequence example assumes that any source packets and channel packets before time zero, i.e., previous to source packet $s_0$ and channel packet $x_0=(s_0, p_0)$ are known to decoder 108 from successful receipt and decoding of previous channel packets.

Sequence 1: Single Loss: Delay=1:
Assume that channel packet $x_0$ is erased. Then decoder 108 uses parity symbol $p_2$ to recover $v_0$, and parity symbol $p_1$ to recover $u_0$.

Sequence 2: Continuous Burst of Channel Packet Losses of Length B=7:
Assume that channel packets $x_0$-$x_6$ are erased. Then decoder 108 skips parity symbol $p_7$, and uses parity symbols $p_8$-$p_{11}$ to decode $v_0$-$v_6$. Decoder 108 uses parity symbols $p_{12}, \ldots, p_{18}$ to decode $u_0$ to $u_6$ sequentially.

Generalized properties of the second example code are now discussed. The second example code is a code that exhibits structured intra-packet sparsity. The factor graph of FIG. 7 can be generalized as follows:
a. The coding vectors have the following form {[A0, 0], [0, B1], [0, B10], [A11, B11]}. Thus the coefficients except at time $t=11$ ($t_{11}$) are all sparse.

A general principle is that there is structured sparsity within each coding vector during parity check generation.

Figure 8:
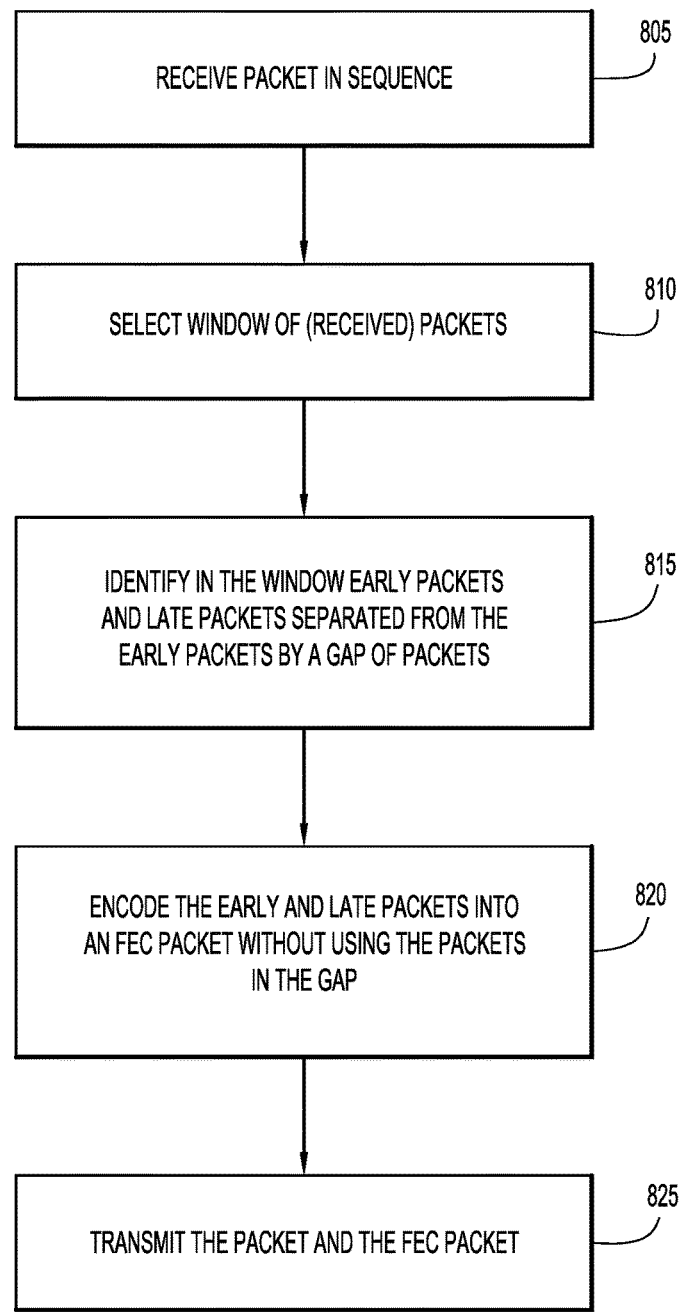
FIG. 8 is a flowchart of an example method of encoding using an inter-packet sparse code performed by the encoder, according to an example embodiment.

With reference to FIG. 8, there is a flowchart of an example method 800 of encoding using an inter-packet sparse code performed by encoder 104. Method 800 assumes a steady state condition in which encoder 104 has been receiving, and continues to receive, successive, time ordered source packets representative of a sequence of packets. In the description of method 800, the "source packets" are referred to simply as "packets."

At 805, encoder 104 receives a (current) packet.

At 810, encoder 104 selects a window of at least previous packets of the sequence of packets. The window may also include the packet received at 805 as well as the previous packets.

At 815, encoder 104 identifies in the window, based on an inter-packet sparse code, one or more earlier packets (i.e., earlier received packets) and one or more later packets (i.e., later received packets with respect to the earlier received packets) separated from the one or more earlier packets by a gap including gap packets. In other arrangements, the window may include multiple such gaps each separated from the next by at least one packet, i.e., each of the multiple gaps may be separated from each immediately adjacent gap by at least one packet.

At 820, encoder 104 encodes the one or more earlier packets and the one or more later packets into a parity packet (also referred to as "an FEC packet") corresponding to the packet, without using any of the gap packets.

At 825, encoder 104 transmits the FEC packet (i.e., the parity packet) and the received packet. In one example, encoder 104 combines the FEC packet and the received packet into a single channel packet and transmits the channel packet. In another example, encoder 104 does not combine the packet and the FEC packet and transmits them separately.

Over time, encoder 104 repeats operations 805-825 for each successively received packet. In each iteration through operations 805-825, at 815, the encoder slides the window across the received packets by at least one packet, so that the (slid) window includes at least one packet that was received later than any of the packets in the window used in the previous iteration.

Figure 9:
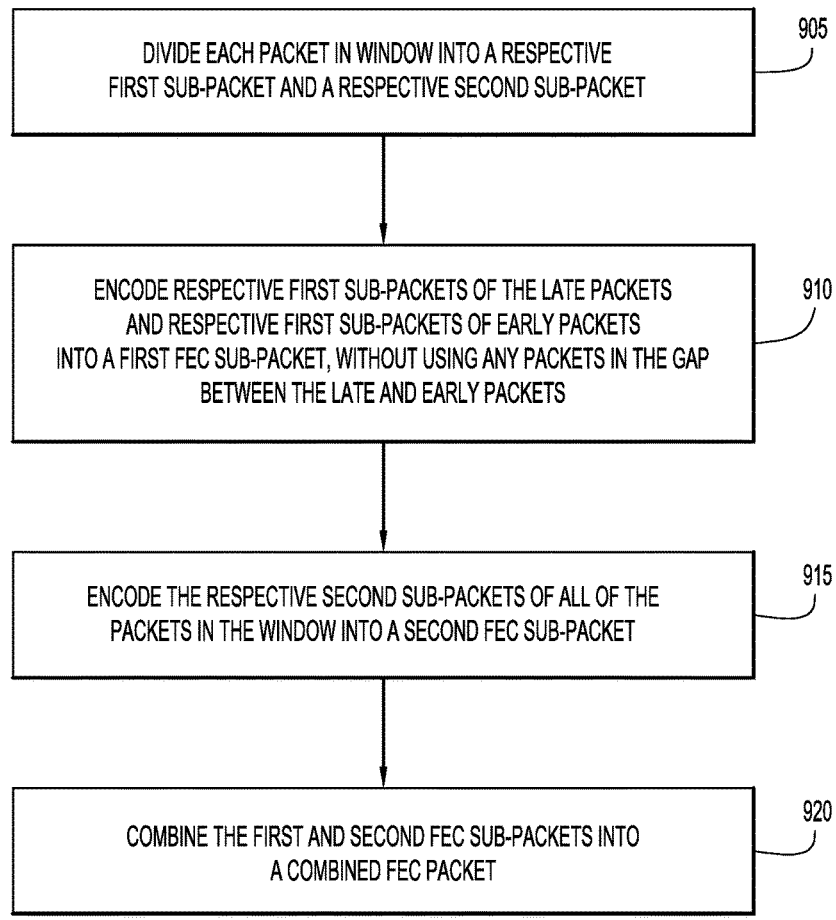
FIG. 9 is a flowchart of an example method of encoding using an intra-packet sparse code that is performed by the encoder as a variation of the method of FIG. 8, according to an example embodiment.

With reference to FIG. 9, there is a flowchart of an example method 900 of encoding using an intra-packet sparse code that is performed by encoder 104 as a variation of method 800. Method 900 begins after operation 815, which is performed based on the intra-packet sparse code, and expands on encoding operation 820. For method 900, it is assumed that each packet includes a plurality of (source) symbols.

At 905, encoder 104 divides each packet of the window (selected at operation 810) into a respective first sub-packet (e.g., u) of symbols having less bits/bytes than the packet and a respective second sub-packet (e.g., v) of symbols having less bits/bytes than the packet.

At 910, encoder 104 encodes the respective first sub-packets of the one or more later packets (e.g., $u_{11}$ in FIG. 7) and the respective first sub-packets of the one or more earlier packets (e.g., $u_0$ in FIG. 7) into a first parity sub-packet (also referred to as a first "FEC sub-packet") having less bits/bytes than the packet, without using the first sub-packets of the gap packets (e.g., without using $u_1$-$u_{10}$ in FIG. 7).

At 915, encoder 104 encodes the respective second sub-packets of all of the packets in the window (e.g., using all of $v_1$-$v_{11}$ of FIG. 7) into a second FEC sub-packet having less bits/bytes than the packet.

At 920, encoder 104 combines the first FEC sub-packet and the second FEC sub-packet into the FEC packet (e.g., $p_{12}$ in FIG. 7), wherein the FEC packet has less bits/bytes than the packet.

In another embodiment for operations 910-920, the first FEC sub-packet, the second FEC sub-packet, and the combined FEC sub-packet do not have less bits/bytes than the packet, respectively. The FEC sub-packets and the combined FEC sub-packet may each be the same size or of a greater size than the packet.

Figure 10:
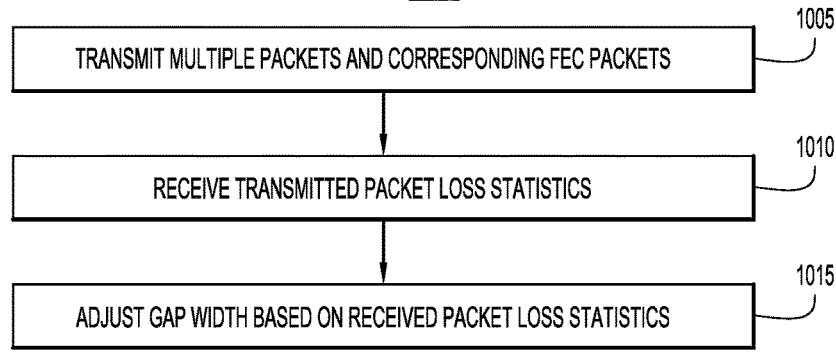
FIG. 10 is a flowchart of an example method of adjusting a gap width of a packet gap used with either of the methods of FIG. 8 or FIG. 9, according to an example embodiment.

With reference to FIG. 10, there is a flowchart of an example method 1000 of adjusting a gap width of a packet gap used with either method 800 or method 900.

At 1005, encoder 104 transmits multiple ones of the source packets and corresponding FEC packets generated in method 800 (or 900).

At 1010, encoder 104 receives indications of burst packet losses experienced by the multiple ones of the transmitted source packets and the FEC packets. The indications may include a number of packets lost or a length of the burst packet losses in time.

At 1015, encoder 104 adjusts the total number of the gap packets based on the received information so as to mitigate the burst losses. Encoder 104 may also adapt an FEC encoding rate to better match the loss statistics.

Figure 11:
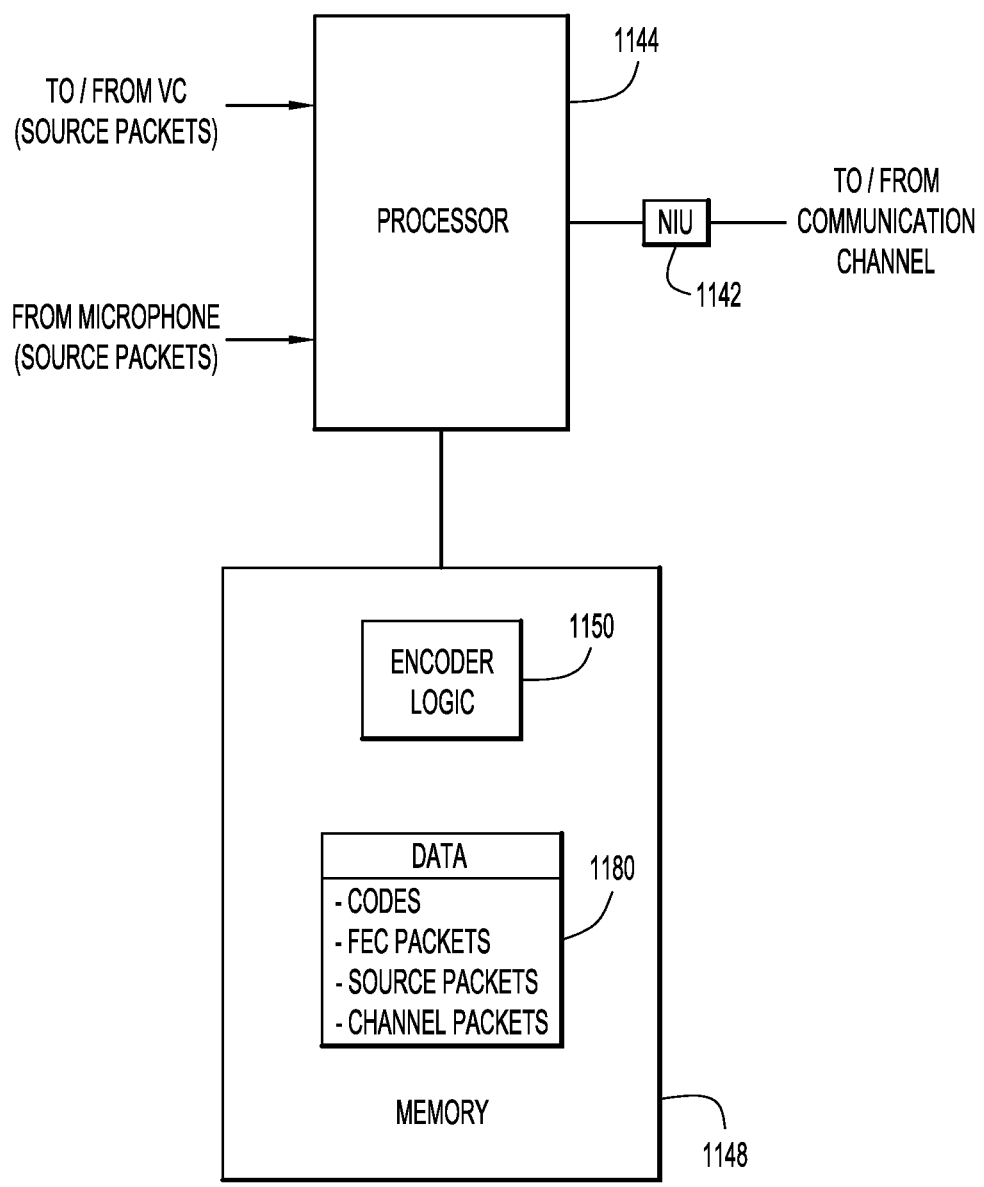
FIG. 11 is a block diagram of a controller or processor used for performing encoding methods, according to an example embodiment.

Reference is now made to FIG. 11, which shows an example block diagram of a controller 1100 of transmitter 102 configured to perform the encoding methods described above. There are numerous possible configurations for controller 1100 and FIG. 11 is meant to be an example. Controller 1108 includes a network interface unit 1142, a processor 1144, and memory 1148. The network interface (I/F) unit (NIU) 1142 is, for example, an Ethernet card or other interface device that allows the controller 1108 to communicate over communication network 110. Network I/F unit 1142 may include wired and/or wireless connection capability.

Processor 1144 may include a collection of microcontrollers and/or microprocessors, for example, each configured to execute respective software instructions stored in the memory 1148. The collection of microcontrollers may include, for example: a video controller to receive, send, and process video signals related to a video camera (VC) (not shown); an audio processor to receive, send, and process audio signals related to a loudspeaker (not shown) and a microphone (not shown); and a high-level controller to provide overall control. Portions of memory 1148 (and the instructions therein) may be integrated with processor 1144. Using encoding methods described herein, processor 1144 encodes audio/video captured by the microphone/video camera, encodes the captured audio/video into data packets, and causes the encoded data packets to be transmitted to communication network 110. For example, processor 1144 encodes contiguous 20 millisecond segments of audio detected by the microphone (which are representative of the source packets) into corresponding channel packets. As used herein, the terms "audio" and "sound" are synonymous and interchangeably.

The memory 1148 may comprise read only memory (ROM), random access memory (RAM), magnetic disk storage media devices, optical storage media devices, flash memory devices, electrical, optical, or other physical/tangible (e.g., non-transitory) memory storage devices. Thus, in general, the memory 1148 may comprise one or more computer readable storage media (e.g., a memory device) encoded with software comprising computer executable instructions and when the software is executed (by the processor 1144) it is operable to perform the operations described herein. For example, the memory 1148 stores or is encoded with instructions for Encoder logic 1150 to perform operations described herein for encoding using inter- and intra-packet sparse codes.

In addition, memory 1148 stores data 1180 used and generated by logic 1150, including, but not limited to: generalized inter- and intra-sparse codes, source packet memory buffers from which windows of received source packets may be selected, FEC packets, and combined source and FEC packets.

In summary, embodiments herein are directed to a new class of forward error correction (FEC) codes for real-time streaming sources that provide effective concealment and recovery methods for burst packet losses. The codes may be used for encoding and decoding real-time multimedia data streams in audio-visual conferencing, for example. The codes are used to encode a source stream in a causal fashion, and reconstruct the source stream in a sequential fashion. Unlike conventional codes, the new codes enable strategic recovery of earlier packets first. The codes provide this property for both isolated and burst losses. This is a valuable property for applications which require low latency, such as voice-over-Internet. The delay is a function of the erasure pattern. Erasure bursts with smaller lengths will incur a smaller delay than erasure bursts with longer lengths. The code achieves a low encoding and decoding delay suitable for conferencing applications. The code achieves lower error probability than other FEC codes under a given delay constraint. The codes dramatically improve the concealment and recovery for burst packet losses.

In summary, in one form, a method is provided comprising: receiving a sequence of packets, and for each packet: selecting a window of at least previous packets in the sequence of packets; identifying in the window one or more earlier packets among the previous packets and one or more later packets separated from the one or more earlier packets by a gap including gap packets; encoding the one or more earlier packets and the one or more later packets into a forward error correction (FEC) packet corresponding to (i.e., associated with) the packet, without using any of the gap packets; and transmitting the FEC packet and the packet.

In another form, an apparatus is provided comprising: a network interface unit configured to enable communications over a network; and a processor coupled with the network ports and configured to: receive a sequence of packets, and for each packet: select a window of at least previous packets in the sequence of packets; identify in the window one or more earlier packets among the previous packets and one or more later packets separated from the one or more earlier packets by a gap including gap packets; encode the one or more earlier packets and the one or more later packets into a forward error correction (FEC) packet corresponding to (i.e., associated with) the packet, without using any of the gap packets; and transmit the FEC packet and the packet.

In yet another form, a computer readable storage media stores instructions that, when executed by a processor, cause the processor to: receive a sequence of packets, and for each packet: select a window of at least previous packets in the sequence of packets; identify in the window one or more earlier packets among the previous packets and one or more later packets separated from the one or more earlier packets by a gap including gap packets; encode the one or more earlier packets and the one or more later packets into a forward error correction (FEC) packet corresponding to (i.e., associated with) the packet, without using any of the gap packets; and transmit the FEC packet and the packet.

The above description is intended by way of example only. Various modifications and structural changes may be made therein without departing from the scope of the concepts described herein and within the scope and range of equivalents of the claims.

What is claimed is:

1. A method comprising:
   receiving a sequence of packets; and
   for each packet:
      selecting a window that includes at least previous packets in the sequence of packets;
      identifying in the window one or more earlier packets among the previous packets and one or more later packets separated from the one or more earlier packets by a gap including gap packets;

encoding the one or more earlier packets and the one or more later packets into a forward error correction (FEC) packet corresponding to the packet, without using any of the gap packets; and transmitting the FEC packet and the packet.

2. The method of claim 1, further comprising:

combining the packet and the FEC packet into a combined packet, wherein the transmitting includes transmitting the combined packet.

3. The method of claim 1, wherein the transmitting includes transmitting the FEC packet and the packet as separate packets.

4. The method of claim 1, wherein:

the selecting includes selecting the window to include the packet in addition to the previous packets; and the identifying includes identifying the one or more later packets to include the packet.

5. The method of claim 1, wherein the previous packets of the window are contiguous, the one or more earlier packets include at least two contiguous packets, and the gap packets are contiguous packets.

6. The method of claim 1, wherein the selecting includes, for each packet, sliding the window across the sequence of packets by at least one packet so that the window after sliding includes packets that were received later than the packets in the window corresponding to each previous packet.

7. The method of claim 1, wherein a total number of the gap packets by which the one or more first packets and the one or more second packets are separated is adjustable, and the method further comprises, over time:

transmitting multiple packets and corresponding FEC packets;

receiving indications of burst packet losses experienced by the transmitted multiple packets; and adjusting the total number of the gap packets based on the received indications so as to mitigate the burst losses.

8. The method of claim 7, wherein the adjusting includes increasing and decreasing the total number of gap packets based on indications of increasing and/or decreasing burst packet losses.

9. The method of claim 1, wherein the encoding includes linearly combining the one or more earlier packets and the one or more later packets to produce the FEC packet.

10. The method of claim 1, further comprising:

dividing each packet of the window into a respective first sub-packet having less bits than the packet and a respective second packet having less bits than the packet, wherein the encoding includes:

encoding the respective first sub-packets of the one or more later packets and the respective first sub-packets of the one or more earlier packets into a first FEC sub-packet, without using the first sub-packets of the gap packets;

encoding the respective second sub-packets of all of the window packets into a second FEC sub-packet; and combining the first FEC sub-packet and the second FEC sub-packet into the FEC packet.

11. The method of claim 1, wherein the packets are audio packets or video packets.

12. An apparatus comprising:

a network interface unit configured to enable communications over a network; and a processor coupled with the network ports and configured to:

receive a sequence of packets, and for each packet:

select a window of at least previous packets in the sequence of packets;

identify in the window one or more earlier packets among the previous packets and one or more later packets separated from the one or more earlier packets by a gap including gap packets;

encode the one or more earlier packets and the one or more later packets into a forward error correction (FEC) packet corresponding to the packet, without using any of the gap packets; and transmit the FEC packet and the packet.

13. The apparatus of claim 12, wherein the previous packets of the window are contiguous, the one or more earlier packets include at least two contiguous packets, and the gap packets are contiguous packets.

14. The apparatus of claim 12, wherein the processor is configured to select by, for each packet, sliding the window across the sequence of packets by at least one packet so that the slid window after sliding includes packets that were received later than the packets in the window corresponding to each previous packet.

15. The apparatus of claim 12, wherein a total number of the gap packets by which the one or more first packets and the one or more second packets are separated is adjustable, and the processor is further configured to, over time:

transmit multiple packets and corresponding FEC packets;

receive indications of burst packet losses experienced by the transmitted multiple packets; and adjust the total number of the gap packets based on the received indications so as to mitigate the burst losses.

16. The apparatus of claim 12, wherein the processor is configured to encode by linearly combining the one or more earlier packets and the one or more later packets to produce the FEC packet.

17. A non-transitory computer readable storage media encoded with instructions that, when executed by a processor, cause the processor to:

receive a sequence of packets, and for each packet:

select a window of at least previous packets in the sequence of packets;

identify in the window one or more earlier packets among the previous packets and one or more later packets separated from the one or more earlier packets by a gap including gap packets;

encode the one or more earlier packets and the one or more later packets into a forward error correction (FEC) packet corresponding to the packet, without using any of the gap packets; and transmit the FEC packet and the packet.

18. The computer readable storage media of claim 17, wherein the previous packets of the window are contiguous, the one or more earlier packets include at least two contiguous packets, and the gap packets are contiguous packets.

19. The computer readable storage media of claim 17, wherein the instructions to cause the processor to select include instructions to cause the processor to, for each packet, slide the window across the sequence of packets by at least one packet so that the window after sliding includes packets that were received later than the packets in the packet window corresponding to each previous packet.

20. The computer readable storage media of claim 17, wherein a total number of the gap packets by which the one or more first packets and the one or more second packets are separated is adjustable, and the computer readable storage media further includes instructions to cause the processor to, over time:
- transmit multiple packets and corresponding FEC packets;
- receive indications of burst packet losses experienced by the transmitted multiple packets; and
- adjust the total number of the gap packets based on the received indications so as to mitigate the burst losses.

21. The computer readable storage media of claim 17, wherein the instructions to cause the processor to encode include instructions to cause the processor to linearly combine the one or more earlier packets and the one or more later packets to produce the FEC packet.

* * * * *